United States Patent
Davis et al.

(10) Patent No.: US 6,529,923 B2
(45) Date of Patent: *Mar. 4, 2003

(54) METHOD FOR IMPROVING THE ACCURACY IN THE DETERMINATION OF A WAVEFORM CENTER OF A WAVEFORM SIGNAL

(75) Inventors: Michael A. Davis, Alexandria, VA (US); David G. Bellemore, Wallingford, CT (US)

(73) Assignee: CiDRA Corporation, Wallingford, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 119 days.

(21) Appl. No.: 09/087,447

(22) Filed: May 29, 1998

(65) Prior Publication Data

US 2001/0011289 A1 Aug. 2, 2001

(51) Int. Cl.⁷ .................................................. G06F 7/00
(52) U.S. Cl. .......................................... 708/207; 702/66
(58) Field of Search ................................ 708/207, 317; 702/66, 73; 327/58, 59, 60, 62

(56) References Cited

U.S. PATENT DOCUMENTS

| | | | |
|---|---|---|---|
| 5,260,647 A | 11/1993 | Swerlein | 324/111 |
| 5,274,569 A | 12/1993 | Prasad | 364/486 |
| 5,365,428 A * | 11/1994 | dePinto et al. | 128/696 |
| 5,504,318 A * | 4/1996 | Joseph et al. | 235/462 |
| 5,548,232 A * | 8/1996 | Yamaura et al. | 327/60 |
| 5,610,827 A | 3/1997 | Reilly | 364/487 |
| 5,818,585 A | 10/1998 | Davis et al. | 356/345 |
| 5,987,392 A * | 11/1999 | Tucker et al. | 702/66 |

FOREIGN PATENT DOCUMENTS

EP  0463600  6/1991

* cited by examiner

*Primary Examiner*—Chuong Dinh Ngo
(74) *Attorney, Agent, or Firm*—Ware, Fressola, Van Der Sluys & Adolphson LLP

(57) ABSTRACT

Prior to performing a centroid calculation on a waveform signal that is discretely sampled at a limited number of sample points, the last sample point ($V_N$, $A_N$) is eliminated if the magnitude of the amplitude at the first sample point ($A_1$) is greater than the last sample point ($A_N$), and the difference in magnitude between the first and last sample points ($A_1-A_N$) is greater than the difference in magnitude between the second to last sample point and the first sample point ($A_{N-1}-A_1$). The first sample point ($V_1$, $A_1$) is eliminated prior to the centroid calculation if the magnitude of the amplitude at the last sample point ($A_N$) is greater than the first sample point ($A_1$), and the difference in magnitude between the last and first sample points ($A_N-A_1$) is greater than the difference in magnitude between the second sample point and the last sample point ($A_2-A_N$). In a second embodiment of the invention, a first centroid calculation is performed using a set of samples in which one side of the waveform signal has the lowest amplitude value sample. Sample values on the side of the waveform initially having the lowest amplitude value are then eliminated until the opposing side of the waveform has the lowest amplitude value sample. A second centroid calculation is then performed and the two centroid calculations are averaged together to arrive at an average centroid calculation. In a third embodiment of the invention, the amplitude components of the waveform sample values are normalized to the lowest amplitude value sample point and a first centroid calculation is performed on the normalized waveform signal. Next, the waveform is normalized to the lowest amplitude value sample point on the other side of the waveform signal and a second centroid calculation is performed. The two centroid calculations are then averaged to provide an averaged normalized centroid calculation.

10 Claims, 9 Drawing Sheets

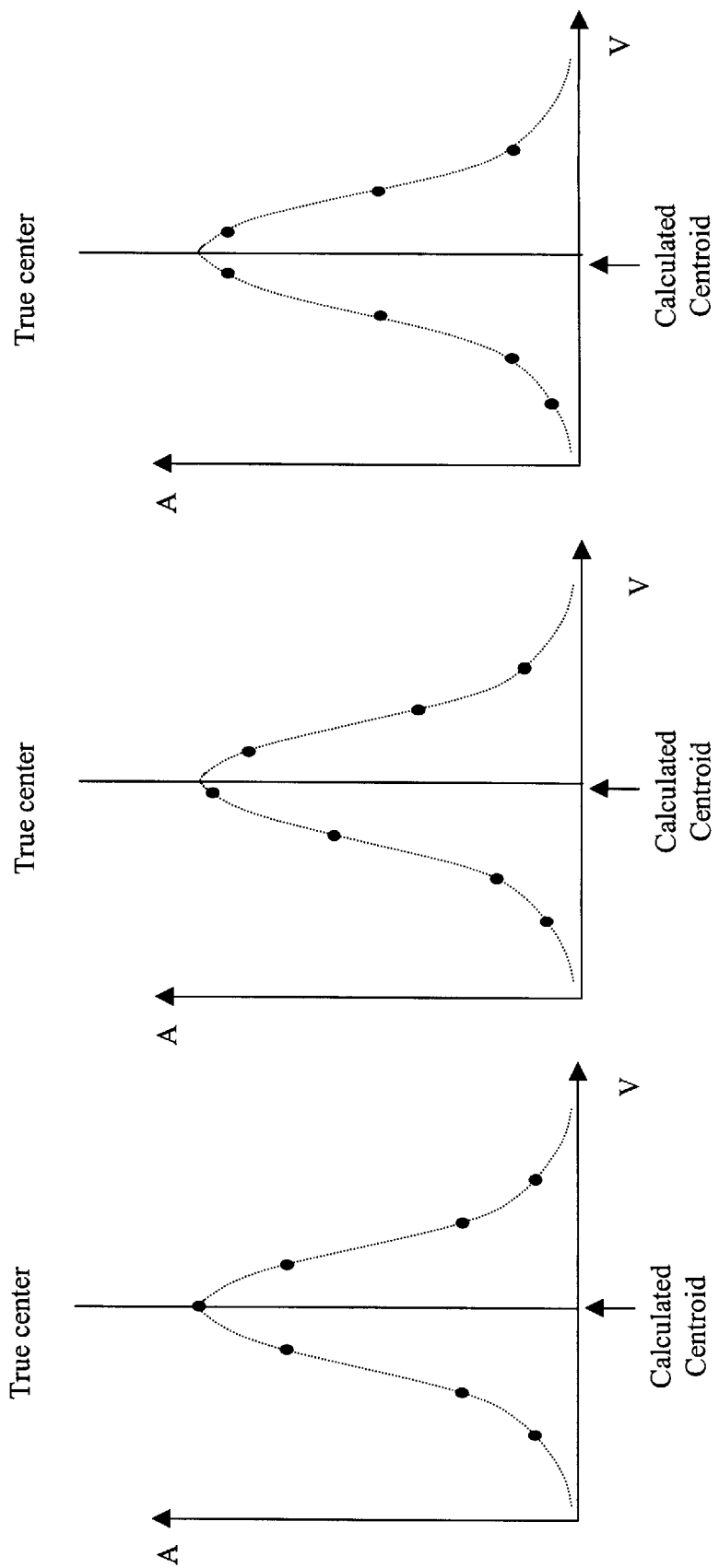

METHOD FOR IMPROVING THE ACCURACY IN THE DETERMINATION OF A WAVEFORM CENTER OF A WAVEFORM SIGNAL

TECHNICAL FIELD

The present invention relates to signal processing, and more particularly to the determination of a center value of a waveform signal.

BACKGROUND OF INVENTION

Often it is necessary to determine a center value, such as a center wavelength, of a waveform signal to a high precision. The degree of precision required for different applications varies, but often precision better than 1 part in 300 of the full width at half max (FWHM) of the waveform signal is required. A simple technique to determine the center of a waveform signal is to use a centroid (or center of mass) calculation over an area of interest. For a discretely, evenly sampled waveform signal the basic equation for the calculation of the centroid is:

$$V_C = \frac{\sum_N V_N \cdot A_N}{\sum_N A_N} \quad (1)$$

where N is the total number of samples for each value ($V_N$), and $A_N$ is the sampled amplitude. As seen in the above equation each sample point is weighted by the amplitude at that point. This calculation can be performed quickly on a sampled waveform signal and is therefore useful in real-time computer algorithms. Equation 1 can be used for example to determine the center wavelength ($\lambda_C$) of a waveform signal where a number N of discrete power level ($P_N$) measurements are taken for each wavelength ($\lambda_N$).

The number of sampled points in the calculation is critical when using Equation 1, ideally the samples should span the entire waveform signal of interest. However, in practical applications this is not always possible due to factors such as sampling rates and memory requirements. In this case, a fixed number of sample points around the peak value of a waveform signal can be used. However, the locations of the sampled points will introduce errors in the determination of the waveform center provided the points are not perfectly symmetric around the waveform signal. FIGS. 1–3 illustrate examples of sampled waveform signals using a fixed number of points, i.e., seven (7) points. In the example of FIG. 1, the sample points are distributed symmetrically over the waveform signal. However, in FIG. 2, the sample points are shifted relative to the symmetrical sampling locations in FIG. 1 resulting in an asymmetric distribution of the points over the waveform signal and consequently an error in the determination of the center due to the weighting of all the points in Equation 1. FIG. 3 illustrates the extreme case, where again seven discrete sample points are shown. The first point will effectively skew the calculation from the correct value. FIG. 4 illustrates the error associated with asymmetric distribution of discrete sample points. In particular, FIG. 4 shows the percent error in the calculation from the FWHM versus the phase difference between the sampled points and the waveform signal. For a 0-degree phase difference, the peak of the waveform signal coincides exactly with the center-sampled point. For a 180-degree phase shift, the waveform peak is exactly between two sampled points.

The sample error can be reduced by increasing the number of sample points. However, as indicated above, the number of sample points, and therefore the accuracy of centroid determination, is limited by the sampling rate and the available memory. There therefore exists a need for an improved method of determining a center wavelength of an arbitrary waveform signal, particularly where the waveform signal is discretely sampled at a limited number of sample points.

SUMMARY OF THE INVENTION

Objects of the present invention include improved accuracy of the centroid calculation of a waveform signal.

According to a first embodiment of the present invention, a waveform signal is discretely sampled at a limited number of sample points, each sample point being a set ($V_N$, $A_N$) including a sample value ($V_N$) and an amplitude ($A_N$), and N being the number of non-eliminated sample points. Prior to performing a centroid calculation on the waveform signal, the last sample point ($V_N$, $A_N$) is eliminated if the magnitude of the amplitude at the first sample point ($A_1$) is greater than the last sample point ($A_N$), and the difference in magnitude between the first and last sample points ($A_1$–$A_N$) is greater than the difference in magnitude between the second to last sample point and the first sample point ($A_{N-1}$–$A_1$). The first sample point ($V_1$, $A_1$) is eliminated prior to the centroid calculation if the magnitude of the amplitude at the last sample point ($A_N$) is greater than the first sample point ($A_1$), and the difference in magnitude between the last and first sample points ($A_N$–$A_1$) is greater than the difference in magnitude between the second sample point and the last sample point ($A_2$–$A_N$).

In accordance with a second embodiment of the invention, a first centroid calculation is found using a set of samples in which one side of the waveform signal has the lowest amplitude value sample. Sample values on the side of the waveform signal initially having the lowest amplitude value are then eliminated until the opposing side of the waveform has the lowest amplitude value sample. A second centroid calculation is then performed and the two centroid calculations are averaged together to arrive at an average centroid calculation of the waveform signal.

In accordance with a third embodiment of the invention, the amplitude components of the waveform signal sample values are normalized to the lowest amplitude value sample point and a first centroid calculation is performed on the normalized waveform. Next, the waveform is normalized to the lowest amplitude value sample point on the other side of the waveform signal and a second centroid calculation is performed. The two centroid calculations are then averaged to provide an averaged normalized centroid calculation.

The foregoing and other objects, features and advantages of the present invention will become more apparent in light of the following detailed description of exemplary embodiments thereof, as illustrated in the accompanying drawings.

BRIEF DESCRIPTION OF THE DRAWINGS

FIG. 1 is a diagram of a discretely sampled waveform wherein the sample values are symmetrically distributed over the waveform signal;

FIG. 2 is a diagram of the discretely sampled waveform signal of FIG. 1 wherein the sample values are asymmetrically distributed over the waveform signal;

FIG. 3 is a diagram of the discretely sampled waveform signal of FIG. 1 wherein the sample values are asymmetrically distributed over the waveform signal and wherein the peak of the waveform signal is exactly between two sample points;

DETAILED DESCRIPTION OF THE INVENTION

The present invention is particularly well suited for determining the center value (centroid) of a waveform signal. The present invention is particularly suitable for use with a waveform signal having a generally symmetrical distribution, e.g., a Gaussian or Lorentz relationship. However, the present invention is also suitable for use with waveform signals having a generally asymmetrical distribution, such as a Rayleigh function.

The present invention will be described with respect to a waveform signal where the value of interest is wavelength and the amplitude of interest is the power. However, it will be understood by those skilled in the art that the present inventions may be used with any waveform signal representing a value and amplitude of interest.

Figure 4:
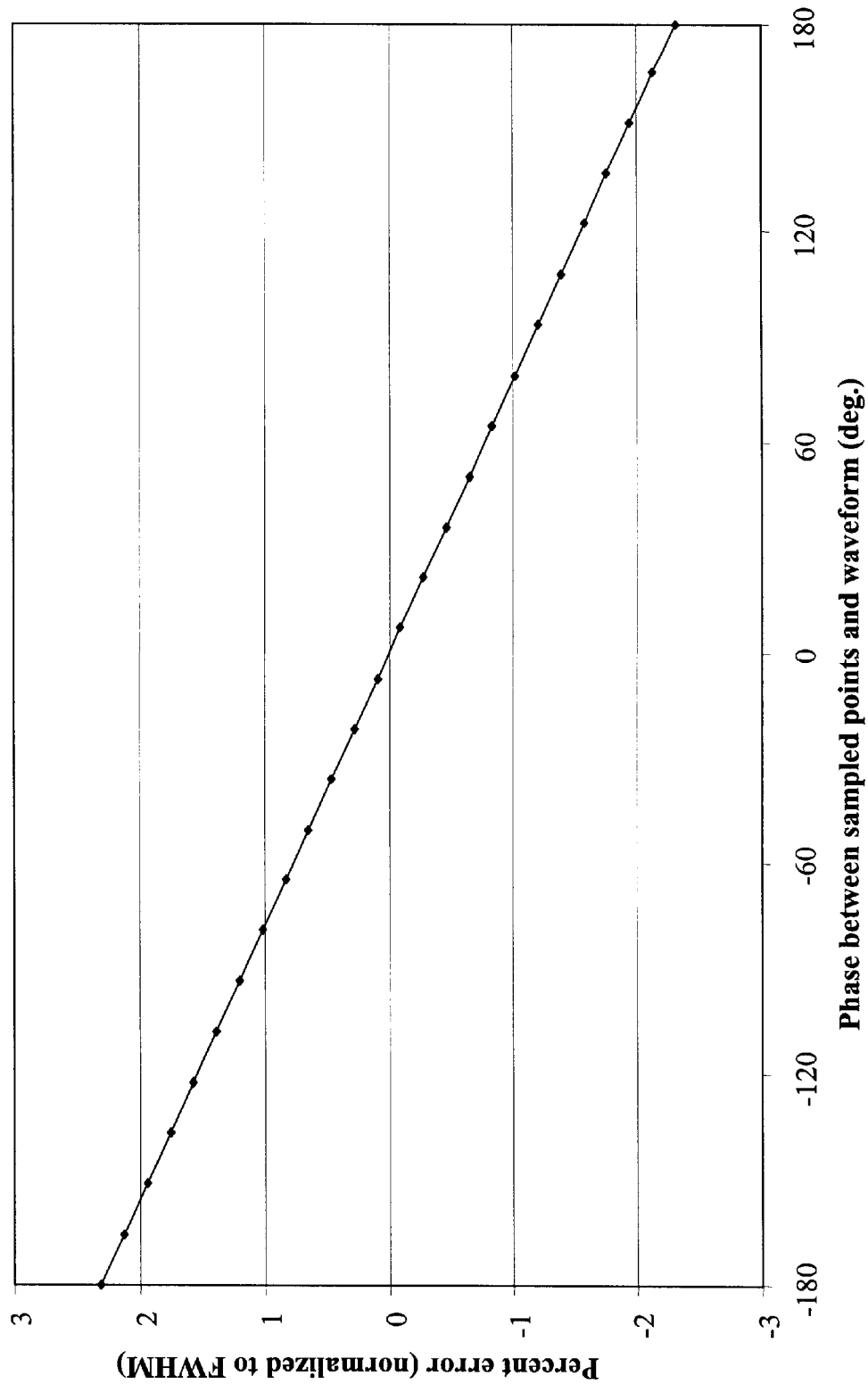
FIG. 4 is a diagram showing the percent error in the calculation from the FWHM versus the phase difference between the sample points and the waveform signal of FIGS. 1–3.

As illustrated in FIGS. 3 and 4, with a 180 degree phase shift (the waveform peak is exactly between two sampled points), one of the sample points (in this case the first point) effectively skews the calculation from the correct value. In accordance with a first embodiment of the invention, by eliminating one of the sample points under certain situations, thereby switching between an even and an odd number of sample points, the error in the calculation of center wavelength is significantly reduced.

Figure 5:
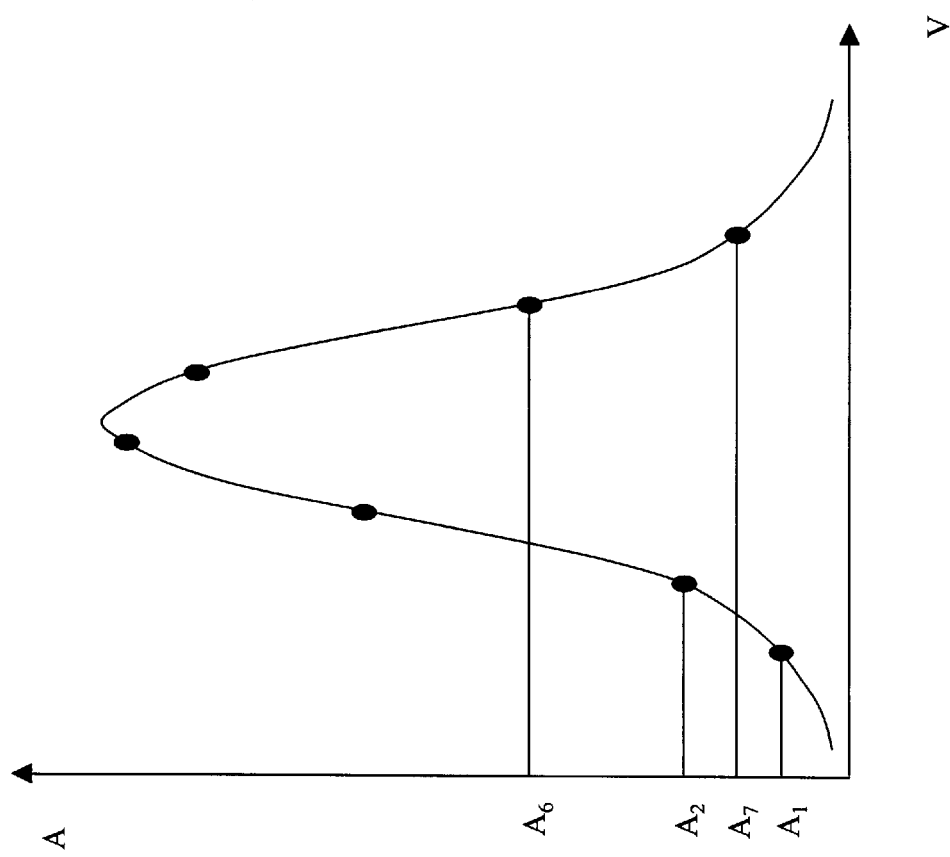
FIG. 5 is a diagram of a discretely sampled waveform signal wherein the sample values are asymmetrically distributed over the waveform signal, and showing the determination of whether one of the sample points should be eliminated prior to calculating the centroid of the waveform signal.
Figure 6:
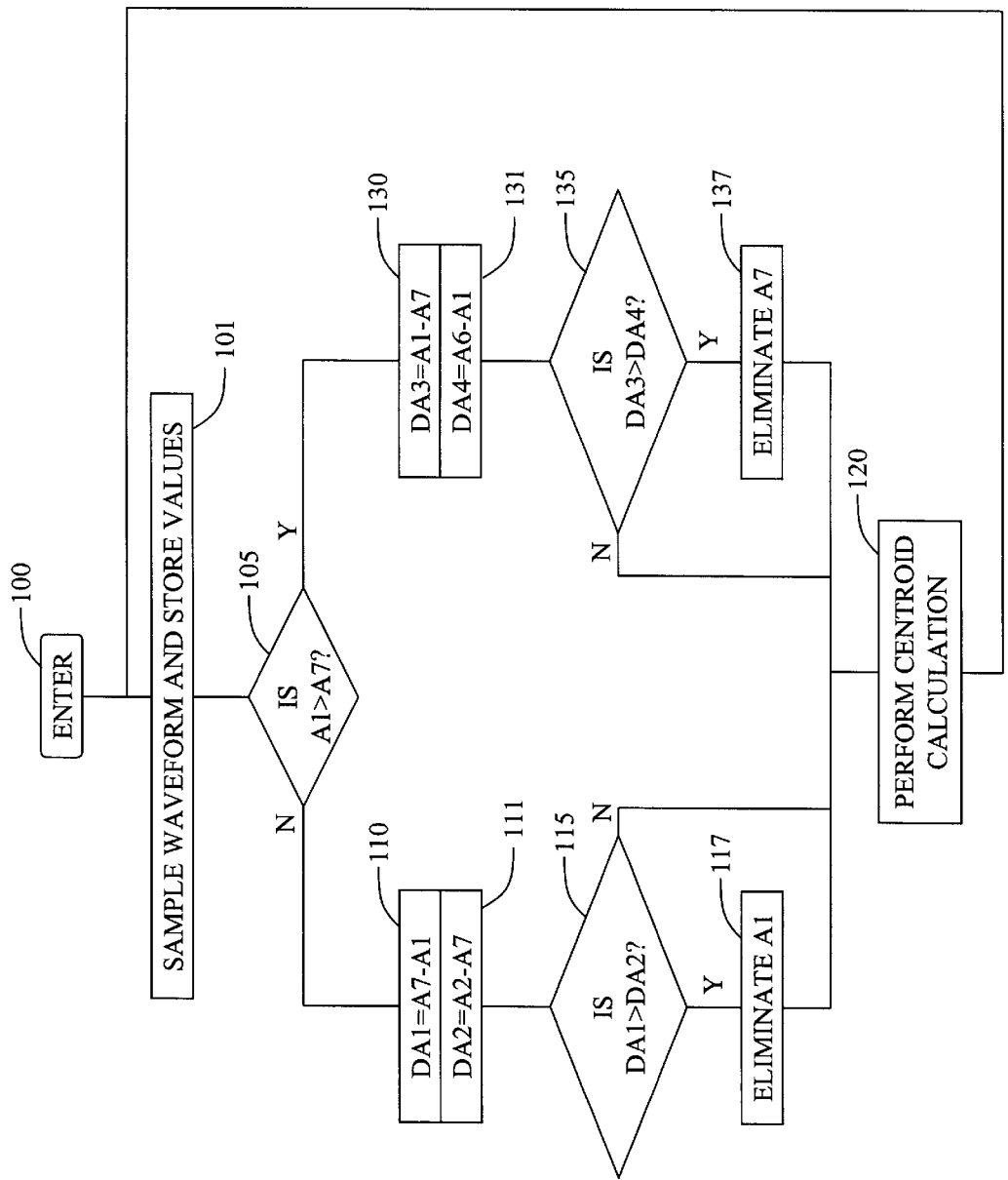
FIG. 6 is a flowchart of a subroutine for determining whether one of the sample points should be eliminated prior to calculating the centroid of the waveform signal of FIG. 5.

FIG. 5 illustrates a waveform signal having an asymmetric distribution of seven sample points. The determination of whether or not a sample point should be eliminated can be performed using the subroutine of FIG. 6. Referring to FIGS. 5 and 6, the subroutine is entered in a step 100, and in a step 101, the waveform signal of interest is sampled and the sample values ($V_N$, $A_N$) are stored in memory. In the present example, seven (7) samples are taken of the waveform signal. However, as described in greater detail herein, any number of samples may be used. Next, a test 105 is performed wherein the amplitude of the first sample ($A_1$) is compared to the amplitude of the last sample ($A_7$). If $A_1$ is less than $A_7$, steps 110 and 111 are consecutively performed wherein the difference in amplitude between $A_1$ and $A_7$ is determined ($DA_1$) and the difference in amplitude between the amplitude of the second sample ($A_2$) and $A_7$ is determined ($DA_2$). Next a test 115 is performed wherein the magnitude of $DA_1$ is compared to the magnitude of $DA_2$. If $DA_1$ is greater than $DA_2$, a step 117 is performed wherein the first sample point is eliminated. The centroid calculation of Equation 1 is then performed on the remaining points in step 120. If $DA_1$ is less than $DA_2$, the centroid calculation is performed on all of the sample points in step 120. The subroutine then returns to step 101 wherein discrete samples of a new waveform signal are taken and stored in memory.

If $A_1$ is greater than $A_7$, the results of the step 105 are positive, and the discrete samples are skewed to the other side of the waveform signal. In this case, steps 130 and 131 are performed wherein the difference in amplitude between $A_1$ and $A_7$ is determined ($DA_3$) and the difference in amplitude between the amplitude of the sixth sample ($A_6$) and $A_1$ is determined ($DA_4$). Next a test 135 is performed wherein the magnitude of $DA_3$ is compared to the magnitude of $DA_4$. If $DA_3$ is greater than $DA_4$, a step 137 is performed wherein the last sample point is eliminated. The centroid calculation of Equation 1 is then performed on the remaining points in step 120. If $DA_3$ is less than $DA_4$, the centroid calculation is performed on all of the sample points in step 120. The subroutine then returns to step 101 wherein discrete samples of a new waveform signal are taken in stored in memory.

Figure 7:
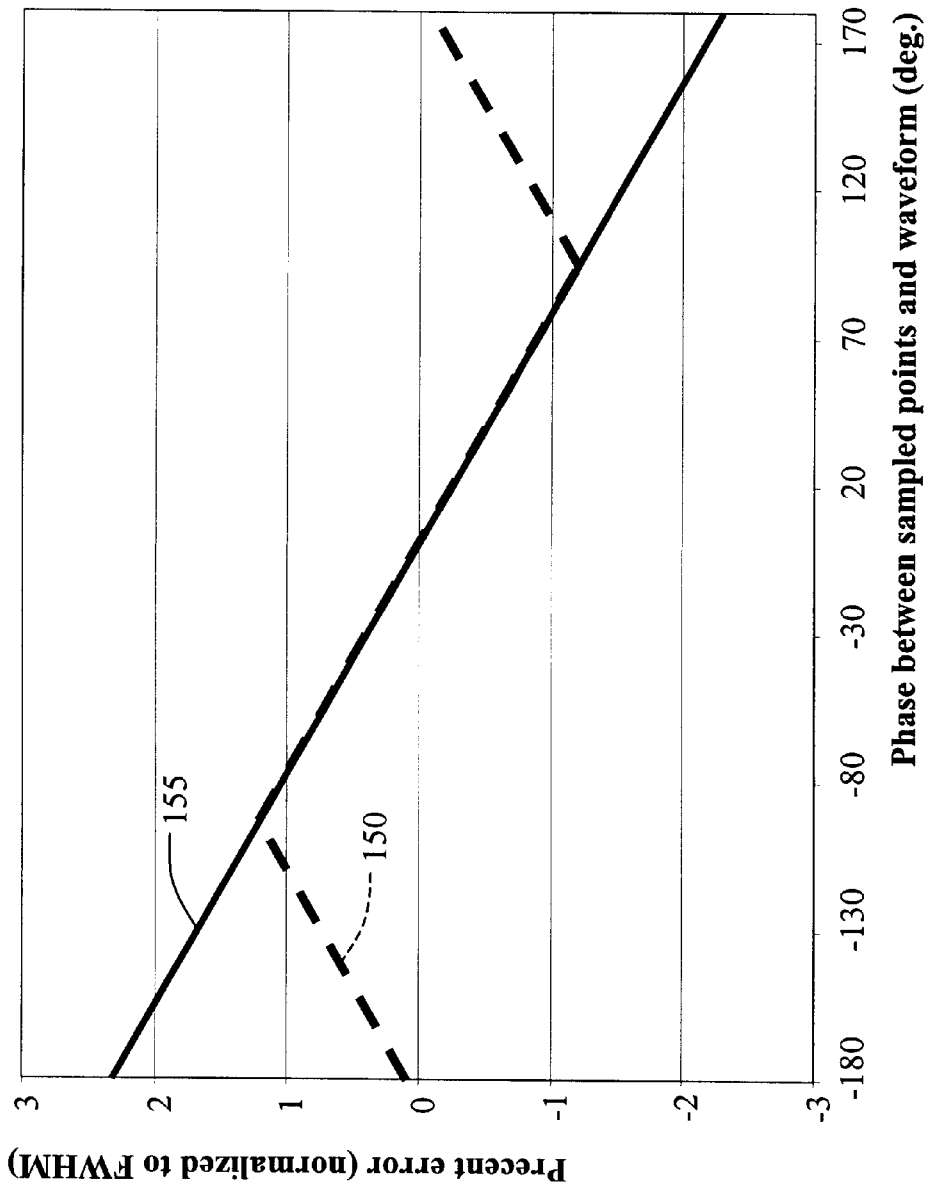
FIG. 7 is a diagram showing the percent error in the calculation from the FWHM versus the phase difference between the sample points and the waveform signal using the flowchart of FIG. 6 for determining the centroid of the waveform signal.

The centroid calculation of FIGS. 5 and 6 provides a significant improvement over the prior art. FIG. 7 shows the reduction in centroid calculation error when the centroid is determined in accordance with the first embodiment of the invention. As can be seen from FIG. 7, the maximum percent error in the calculation from the FWHM versus the phase difference between the sampled points and the waveform signal using the first embodiment of the invention (as illustrated by curve 150) is cut in half with respect to the percent error if the centroid determination in accordance with the first embodiment of the invention is not used (as illustrated by curve 155).

Figure 9:
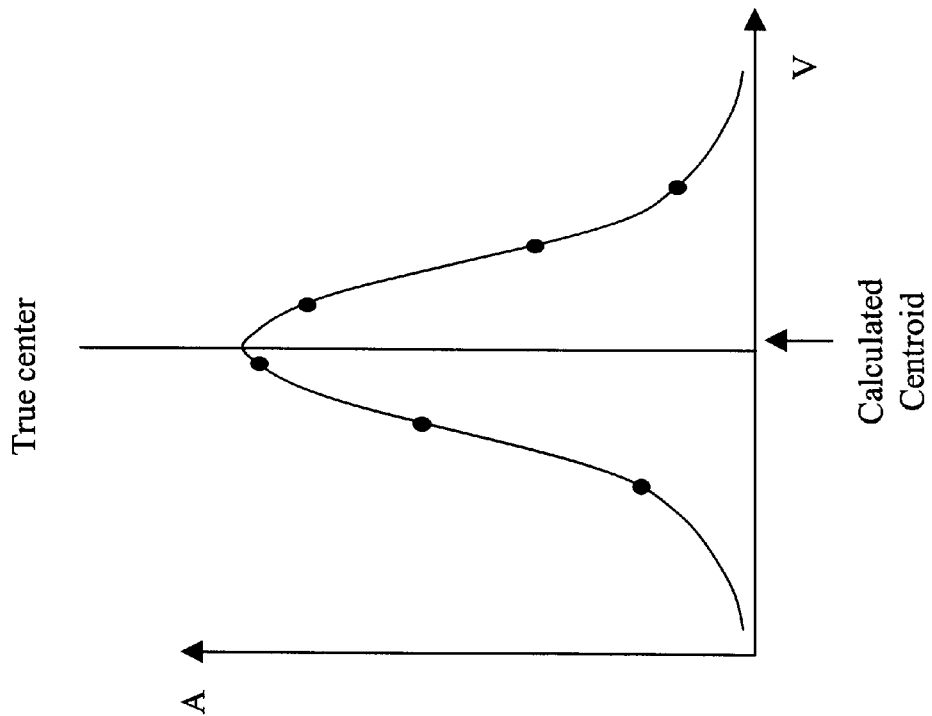
FIG. 9 is a diagram of the discretely sampled waveform signal of FIG. 8 with the sample having the lowest magnitude amplitude eliminated.
Figure 8:
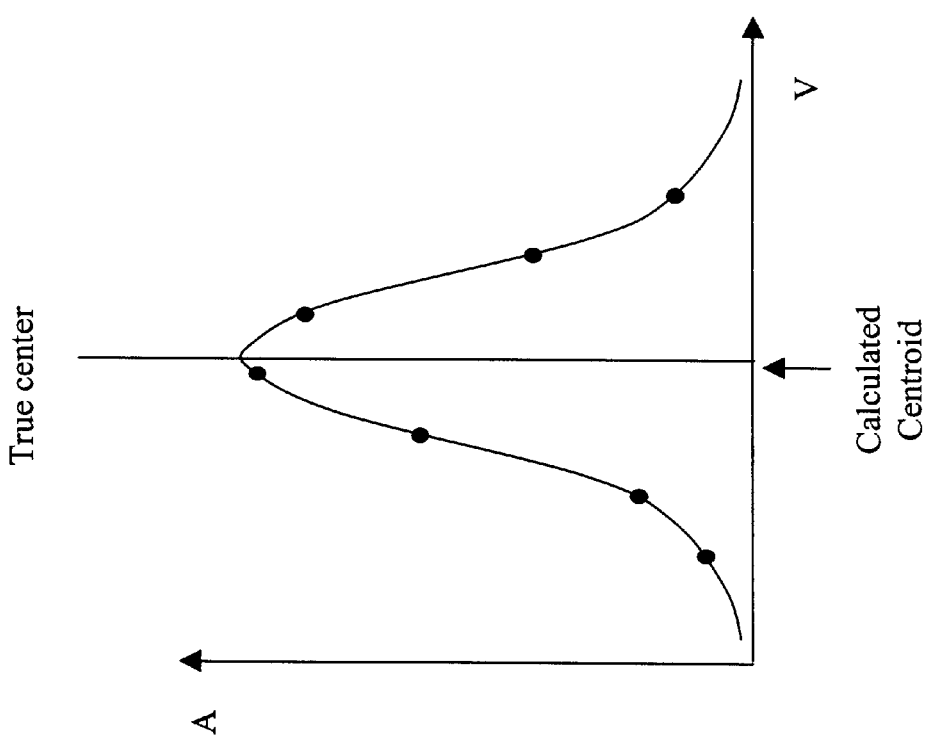
FIG. 8 is a diagram of a discretely sampled waveform signal wherein the sample values are asymmetrically distributed over the waveform signal.
Figure 10:
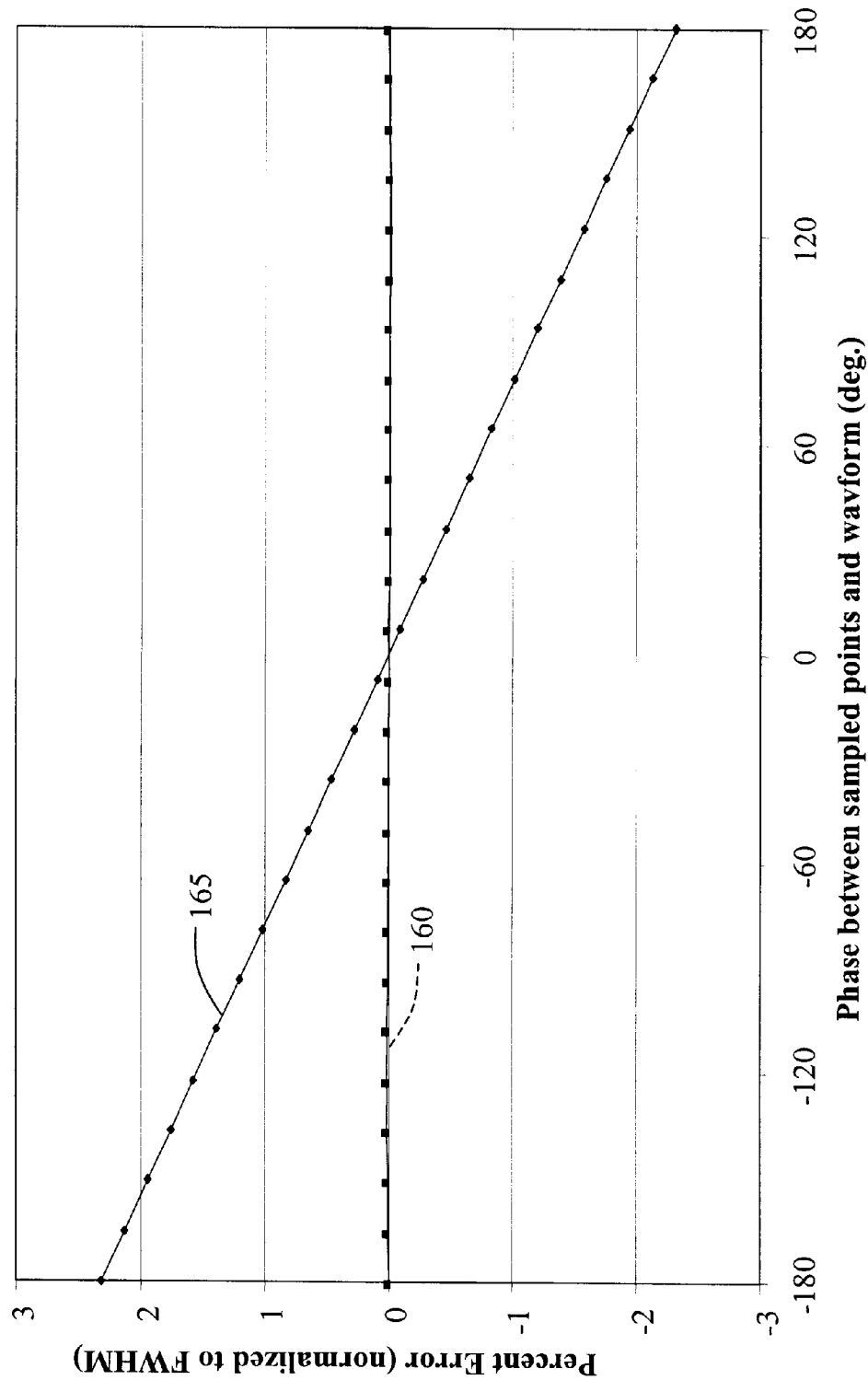
FIG. 10 is a diagram showing the percent error in the calculation from the FWHM versus the phase difference between the sample points and the waveform signal wherein the centroid calculations of the diagrams of FIG. 8 and FIG. 9 are averaged to determine a centroid of the waveform signal in accordance with a second embodiment of the invention.

In a second embodiment of the invention, further reduction in the errors associated with a centroid calculation can be achieved by averaging two centroid calculations for a given asymmetrically sampled waveform signal. Referring to FIG. 8, the first centroid calculation is found using a set of samples in which one side of the waveform has the lowest amplitude value sample. In this case, because of the asymmetry of the discrete samples, the centroid calculated is slightly below the true center. Referring now to FIG. 9, for the same set of samples, sample values on the side of the waveform initially having the lowest amplitude value are eliminated until the opposing side of the waveform signal has the lowest amplitude value sample. A second centroid calculation is then performed using Equation 1. The two centroid calculations are then averaged together to arrive at an average centroid calculation. Since the centroid calculated for the sample values of FIG. 9 are slightly high, due to the asymmetry, the average of the two centroid calculations greatly reduces the errors in the calculation when the sample points are not exactly symmetrically located around the waveform signal. FIG. 10 shows an example of the reduction in centroid calculation error achieved using this averaging technique. Curve 160 is the percent error using the second embodiment of the invention and curve 165 is the percent error using no correction in accordance with the present invention.

Figure 11:
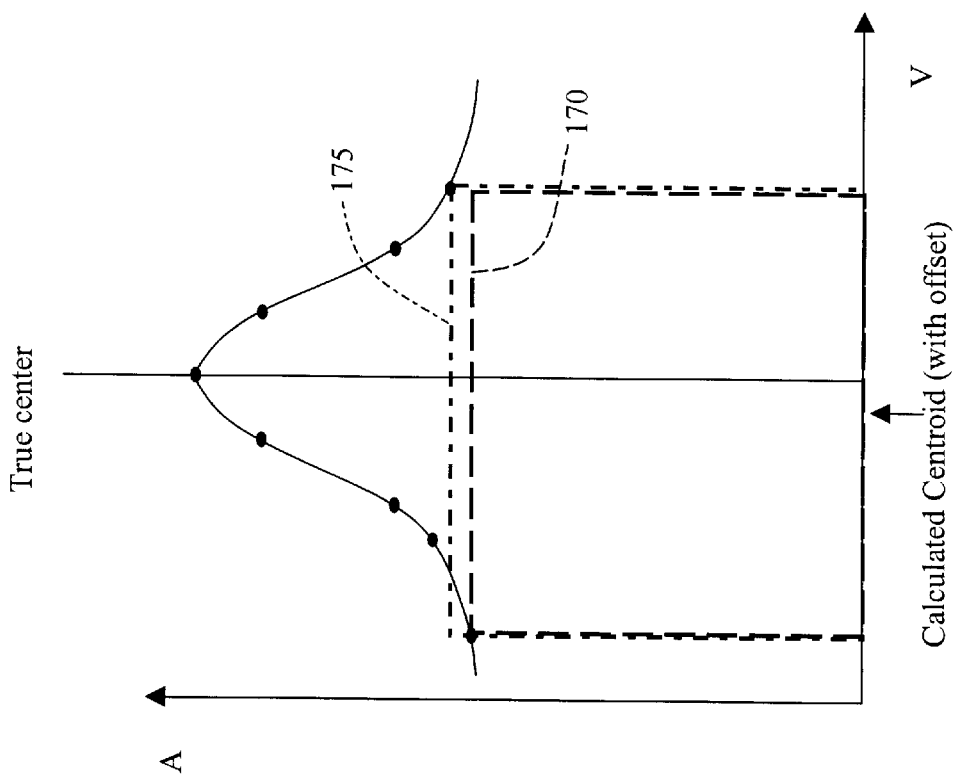
FIG. 11 is a diagram of a discretely sampled waveform signal wherein the sample values are asymmetrically distributed over the waveform signal and wherein the waveform signal is offset in amplitude.
Figure 12:
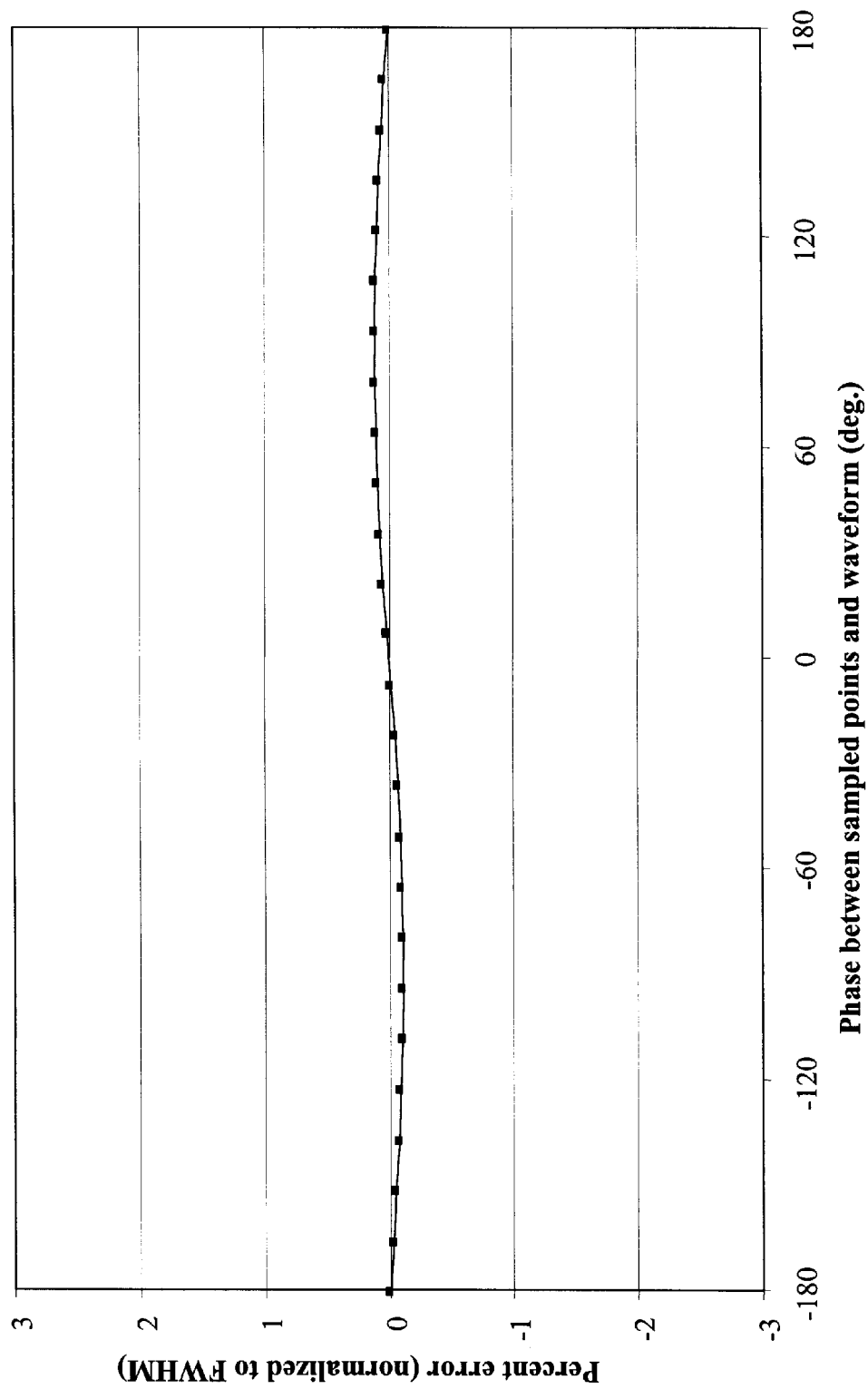
FIG. 12 is a diagram showing the percent error in the calculation from the FWHM versus the phase difference between the sample points and the waveform signal of FIG. 11, wherein the waveform signal is normalized prior to determination of its centroid.

Referring now to FIG. 11, under certain circumstances, the samples may not span the entire waveform signal, or the amplitude values may not return to zero. In this case, an additional error may be introduced in the centroid calculation associated with the offset of the waveform signal from zero. In particular, the centroid calculation will be biased towards the centroid of the offset area. For a large offset area, this biasing effect can negate the effects of the waveform shape itself. A third embodiment of the invention is particularly useful for reducing errors in the calculation of the centroid of the waveform of interest, especially when the waveform contains a fixed offset. In accordance with the third embodiment of the invention, the amplitude components of the waveform sample values are normalized to the lowest amplitude value sample point. FIG. 11 shows that an offset sampled waveform signal is equivalent to the actual waveform signal of interest on top of a fixed offset, or an offset "box" 170. Elimination of this "box" by normalization of the waveform amplitude to the lowest amplitude value sampled point will minimize the offset associated errors in the calculation. After normalization, a centroid calculation is performed on the normalized waveform. Next, sample values on the side of the waveform initially having the lowest amplitude value are eliminated until the opposing side of the waveform signal has the new lowest amplitude value sample. The waveform signal is then normalized to the new lowest amplitude value sample point and a second offset box 175 is eliminated prior to a second centroid calculation being performed. The two centroid calculations are then averaged to provide an averaged normalized centroid calculation. FIG. 12 shows an example of the reduction in centroid calculation error achieved with an averaged normalized centroid calculation.

Although the third embodiment of the invention is described herein as eliminating an "offset box", it will be understood by those skilled in the art that the amplitude values of each of the discrete sample points are simply normalized to the value of the smallest magnitude amplitude value. In effect, this smallest value amplitude value is simply subtracted from all of the other amplitude values.

Rather than performing two normalizations of the waveform signal in accordance with the third embodiment of the invention, either the first embodiment of the invention, wherein sample points are eliminated under certain circumstance, or the second embodiment of the invention, wherein two centroid calculations are averaged, may be used to determine the center value or centroid of the waveform signal of interest after the initial normalization of the waveform signal.

Figure 13:
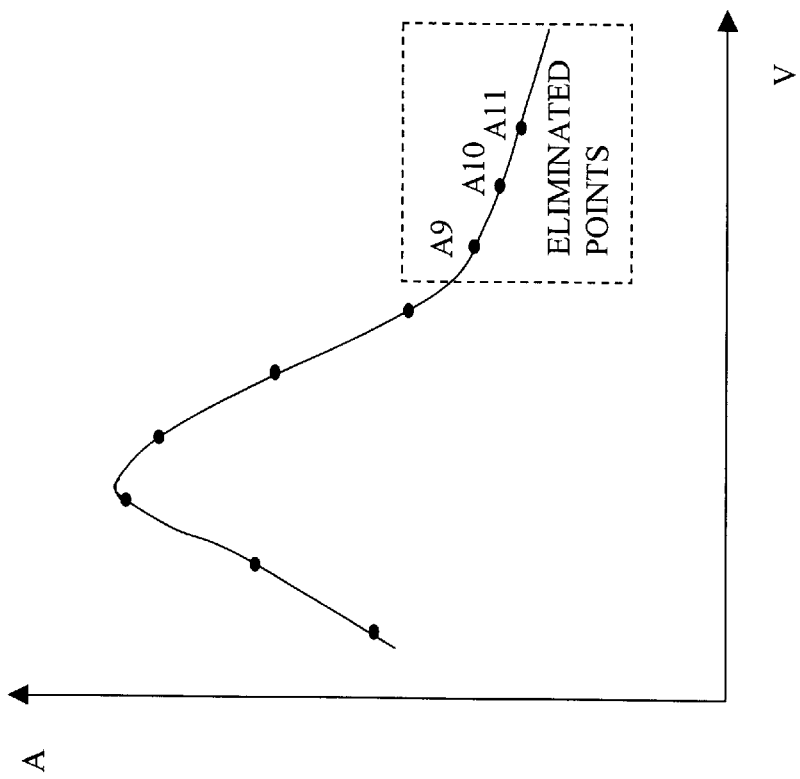
FIG. 13 is a diagram of a discretely sampled waveform signal wherein the sample values are asymmetrically distributed over the waveform signal and wherein a portion of the waveform signal is not sampled.

The present invention has been described thus far wherein the number and distribution of sample points on either side of a waveform signal are generally evenly distributed, with an error in the centroid determination of the waveform signal being introduced by a generally asymmetric distribution of sample points over the waveform signal of interest. However, under certain circumstances, there may be an extremely skewed distribution of sample points on one side of a waveform signal as compared to the other. Referring now to FIG. 13, this situation may occur where the sample values do not span the entire waveform signal or where samples are lost or unusable. Alternatively, if the waveform signal is extremely asymmetric, the distribution of sample points on the waveform signal may be extremely skewed. In this case, it may be desirable to delete certain sample values. For example, sample values on both sides of the waveform signal are compared, and sample values are eliminated on the side of the waveform signal having the lowest amplitude values until there is only one sample value on one side of the waveform signal having a smaller amplitude than the smallest amplitude value on the other side of the waveform signal. In the example of FIG. 13, sample values 9, 10 and 11 are eliminated. After elimination of the sample points, the centroid of the waveform signal may be determined in accordance with the first, second or third embodiments of the invention as described above. Additionally, as described above with respect to the third embodiment of the invention, all of the sample values may be normalized, either before or after elimination of sample points.

The invention has been described herein as using seven (7) discrete sample points over the waveform signal. However, it will be understood by those skilled in the art that any number of sample points may be used with the present invention. The greater the number of sample points, the more accurate the centroid determination will be.

Although the invention has been described and illustrated with respect to exemplary embodiments thereof, the foregoing and various other additions and omissions may be made therein and thereto without departing from the spirit and scope of the present invention.

We claim:

1. A method for determining a centroid ($V_C$) of a waveform signal comprising the steps of:

discretely sampling the waveform signal at a limited number of sample points, wherein each sample point is a set ($V_N$, $A_N$) including a sample value ($V_N$) and an amplitude ($A_N$), and wherein N is the number of non-eliminated sample points;

storing the limited number of sample points;

eliminating the last sample point ($V_N$, $A_N$) if the magnitude of the amplitude at the first sample point ($A_1$) is greater than the last sample point ($A_N$), and the difference in magnitude between the first and last sample points ($A_1$-$A_N$) is greater than the difference in magnitude between the second to last sample point and the first sample point ($A_{N-1}$-$A_1$);

eliminating the first sample point ($V_1$, $A_1$) if the last sample point was not eliminated in the previous step of eliminating, the magnitude of the amplitude at the last sample point ($A_N$) is greater than the first sample point ($A_1$), and the difference in magnitude between the last and first sample points ($A_N$-$A_1$) is greater than the difference in magnitude between the second sample point and the last sample point ($A_2$-$A_N$); and determining the centroid ($V_C$) of the waveform signal using only the remaining sample points in accordance with the following relationship:

$$V_C = \frac{\sum_N V_N \cdot A_N}{\sum_N A_N}$$

in order to provide a resulting signal containing information about the centroid ($V_C$) of the waveform signal.

2. The method of claim 1, further including the step of, prior to the step (d), normalizing the amplitude values ($A_N$) of all of the sample points to the smallest magnitude amplitude value of any of the sample points.

3. The method of claim 1, further including the steps of, prior to the step (b):

(a') selecting the first sample point ($V_1, A_1$) if the amplitude of the first sample point ($A_1$) is less than the amplitude of the last sample point ($A_N$);

(b') eliminating the first sample point if the amplitude of the second sample point ($A_2$) is less than the amplitude of the last sample point ($A_N$);

(c') repeating steps (a') and (b') if the first sample point is eliminated in step (b');

(d') selecting the last sample point ($V_N, A_N$) if the amplitude of the last sample point ($A_N$) is less than the amplitude of the first sample point ($A_1$);

(e') eliminating the last sample point if the amplitude of the second to last sample point ($A_{N-1}$) is less than the amplitude of the first sample point ($A_1$); and (f') repeating steps (d') and (e') if the last sample point is eliminated in step (e').

4. The method of claim 3, further including the step of, prior to the step (d) of determining the centroid ($V_C$) of the waveform signal, normalizing the amplitude values ($A_N$) of all of the sample points to the smallest magnitude amplitude value of any of the sample points.

5. A method for determining a centroid ($V_C$) of a waveform signal comprising the steps of:

discretely sampling the waveform signal at a limited number of sample points, wherein each sample point is a set ($V_N, A_N$) including a sample value ($V_N$) and an amplitude ($A_N$), and wherein N is the number of non-eliminated sample points;

storing the limited number of sample points;

determining a first centroid ($V_{C1}$) of the waveform signal in accordance with the following relationship:

$$V_{C1} = \frac{\sum_N V_N \cdot A_N}{\sum_N A_N};$$

performing the following steps if the amplitude of the first sample point ($A_1$) is less than the amplitude of the last sample point ($A_N$):

eliminating the first sample point and each successive sample point having an amplitude that is less than the amplitude of the last sample point ($A_N$);

determining a second centroid ($V_{C2}$) of the waveform signal in accordance with the following relationship:

$$V_{C2} = \frac{\sum_N V_N \cdot A_N}{\sum_N A_N};$$

determining the centroid ($V_C$) of the waveform signal as the average of the first centroid ($V_{C1}$) and the second centroid ($V_{C2}$);

performing the following steps if the amplitude of the last sample point ($A_N$) is less than the amplitude of the first sample point ($A_1$):

eliminating the last sample point and each previous sample point having an amplitude that is less than the amplitude of the first sample point ($A_1$);

determining a second centroid ($V_{C2}$) of the waveform signal in accordance with the following relationship:

$$V_{C2} = \frac{\sum_N V_N \cdot A_N}{\sum_N A_N};$$

determining the centroid ($V_C$) of the waveform signal as the average of the first centroid ($V_{C1}$) and the second centroid ($V_{C2}$) in order to provide a resulting signal containing information about the centroid ($V_C$) of the waveform signal.

6. The method of claim 5, further including the step of, prior to the step (b), normalizing the amplitude values ($A_N$) of all of the sample points to the smallest magnitude amplitude value of any of the sample points.

7. The method of claim 5, further including the steps of, prior to the step (b):

(a') selecting the first sample point ($V_1, A_1$) if the amplitude of the first sample point ($A_1$) is less than the amplitude of the last sample point ($A_N$);

(b') eliminating the first sample point if the amplitude of the second sample point ($A_2$) is less than the amplitude of the last sample point ($A_N$);

(c') repeating steps (a') and (b') if the first sample point is eliminated in step (b');

(d') selecting the last sample point ($V_N, A_N$) if the amplitude of the last sample point ($A_N$) is less than the amplitude of the first sample point ($A_1$);

(e') eliminating the last sample point if the amplitude of the second to last sample point ($A_{N-1}$) is less than the amplitude of the first sample point ($A_1$); and (f') repeating steps (d') and (e') if the last sample point is eliminated in step (e').

8. The method of claim 7, further including the step of, after step (f') and prior to step (b), normalizing the amplitude values ($A_N$) of all of the sample points to the smallest magnitude amplitude value of any of the sample points.

9. A method for determining a centroid ($V_C$) of a waveform signal comprising the steps of:

discretely sampling the waveform signal at a limited number of sample points, wherein each sample point is a set ($V_N, A_N$) including a sample value ($V_N$) and an amplitude ($A_N$), and wherein N is the number of non-eliminated sample points;

storing the limited number of sample points;

normalizing the amplitude values ($A_N$) of all of the sample points to the smallest magnitude amplitude value of any of the sample points;

determining a first centroid ($V_{C1}$) of the waveform signal in accordance with the following relationship:

$$V_{C1} = \frac{\sum_N V_N \cdot A_N}{\sum_N A_N};$$

performing the following steps if the amplitude of the first sample point ($A_1$) is less than the amplitude of the last sample point ($A_N$):
  eliminating the first sample point and each successive sample point having an amplitude that is less than the amplitude of the last sample point ($A_N$);
  normalizing the amplitude values ($A_N$) of all of the sample points to the smallest magnitude amplitude value of any of the sample points;
  determining a second centroid ($V_{C2}$) of the waveform signal in accordance with the following relationship:

$$V_{C2} = \frac{\sum_N V_N \cdot A_N}{\sum_N A_N};$$

determining the centroid ($V_C$) of the waveform signal as the average of the first centroid ($V_{C1}$) and the second centroid ($V_{C2}$);
performing the following steps if the amplitude of the last sample point ($A_N$) is less than the amplitude of the first sample point ($A_1$):
  eliminating the last sample point and each previous sample point having an amplitude that is less than the amplitude of the first sample point ($A_1$);
  normalizing the amplitude values ($A_N$) of all of the sample points to the smallest magnitude amplitude value of any of the sample points;
  determining a second centroid ($V_{C2}$) of the waveform signal in accordance with the following relationship:

$$V_{C2} = \frac{\sum_N V_N \cdot A_N}{\sum_N A_N};$$

determining the centroid ($V_C$) of the waveform signal as the average of the first centroid ($V_{C1}$) and the second centroid ($V_{C2}$) in order to provide a resulting signal containing information about the centroid ($V_C$) of the waveform signal.

10. The method of claim 9, further including the steps of, prior to the step (b):
  (a') selecting the first sample point ($V_1,A_1$) if the amplitude of the first sample point ($A_1$) is less than the amplitude of the last sample point ($A_N$);
  (b') eliminating the first sample point if the amplitude of the second sample point ($A_2$) is less than the amplitude of the last sample point ($A_N$);
  (c') repeating steps (a') and (b') if the first sample point is eliminated in step (b');
  (d') selecting the last sample point ($V_N,A_N$) if the amplitude of the last sample point ($A_N$) is less than the amplitude of the first sample point ($A_1$);
  (e') eliminating the last sample point if the amplitude of the second to last sample point ($A_{N-1}$) is less than the amplitude of the first sample point ($A_1$); and
  (f') repeating steps (d') and (e') if the last sample point is eliminated in step (e').

* * * * *

UNITED STATES PATENT AND TRADEMARK OFFICE
CERTIFICATE OF CORRECTION

PATENT NO. : 6,529,923 B2
DATED : March 4, 2003
INVENTOR(S) : Davis et al.

It is certified that error appears in the above-identified patent and that said Letters Patent is hereby corrected as shown below:

Column 2,
Lines 48 and 60, after "waveform", please insert -- signal --.

Signed and Sealed this

Tenth Day of August, 2004

JON W. DUDAS
*Acting Director of the United States Patent and Trademark Office*